United States Patent
Subramanian

(10) Patent No.: US 6,958,536 B2
(45) Date of Patent: Oct. 25, 2005

(54) MICROELECTRONIC PACKAGES HAVING RAIL ALONG PORTION OF LID PERIPHERY

(75) Inventor: Jai Subramanian, Liberty Lake, WA (US)

(73) Assignee: Honeywell International Inc., Boise, ID (US)

(*) Notice: Subject to any disclaimer, the term of this patent is extended or adjusted under 35 U.S.C. 154(b) by 0 days.

(21) Appl. No.: 10/416,824

(22) PCT Filed: Oct. 30, 2001

(86) PCT No.: PCT/US01/44849

§ 371 (c)(1),
(2), (4) Date: May 13, 2003

(87) PCT Pub. No.: WO02/41394

PCT Pub. Date: May 23, 2002

(65) Prior Publication Data

US 2004/0070069 A1 Apr. 15, 2004

Related U.S. Application Data

(60) Provisional application No. 60/249,043, filed on Nov. 14, 2000.

(51) Int. Cl.[7] .......................... H01L 23/28; H01L 23/34
(52) U.S. Cl. ...................... 257/717; 257/712; 257/713; 257/796
(58) Field of Search ................................ 257/712, 713, 257/717, 719, 720, 796

(56) References Cited

U.S. PATENT DOCUMENTS

| | | | | |
|---|---|---|---|---|
| 5,482,898 A | | 1/1996 | Marrs | |
| 5,658,831 A | * | 8/1997 | Layton et al. | 29/832 |
| 5,831,836 A | * | 11/1998 | Long et al. | 361/820 |
| 5,956,576 A | * | 9/1999 | Toy et al. | 438/125 |
| 6,068,051 A | | 5/2000 | Wendt | |
| 6,075,289 A | | 6/2000 | Distefano | |
| 6,091,603 A | | 7/2000 | Daves et al. | |
| 6,118,177 A | * | 9/2000 | Lischner et al. | 257/706 |
| 6,222,263 B1 | | 4/2001 | Sherif et al. | |
| 6,271,058 B1 | * | 8/2001 | Yoshida | 438/108 |
| 6,309,909 B1 | | 10/2001 | Ohgiyama | |
| 6,784,540 B2 | * | 8/2004 | Cardwell | 257/722 |

FOREIGN PATENT DOCUMENTS

| | | |
|---|---|---|
| EP | 0 174 020 | 3/1986 |
| JP | 11-195680 | 7/1999 |
| TW | 359863 | 11/1986 |

\* cited by examiner

Primary Examiner—Nathan J. Flynn
Assistant Examiner—Victor A. Mandala, Jr.
(74) Attorney, Agent, or Firm—Wells St. John P.S.

(57) ABSTRACT

The invention encompasses microelectronic package lids, heat spreaders, and semiconductor packages comprising microelectronic lids or heat spreaders. In particular aspects of the present invention, a microelectronic lid comprises a material having a rectangular peripheral shape that defines 4 peripheral sides. Further, the lid has projecting peripheral rails along less than all of the peripheral edge. For instance, the lid can have projecting peripheral rails along only 2 of the sides. Alternatively, such microelectronic lid can be described as comprising a generally rectangular shape defining four peripheral edges, with two of the edges having a greater thickness than the other two edges.

14 Claims, 5 Drawing Sheets

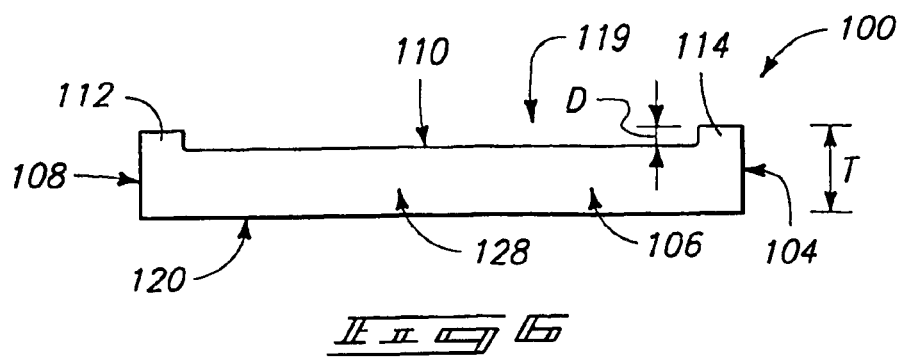
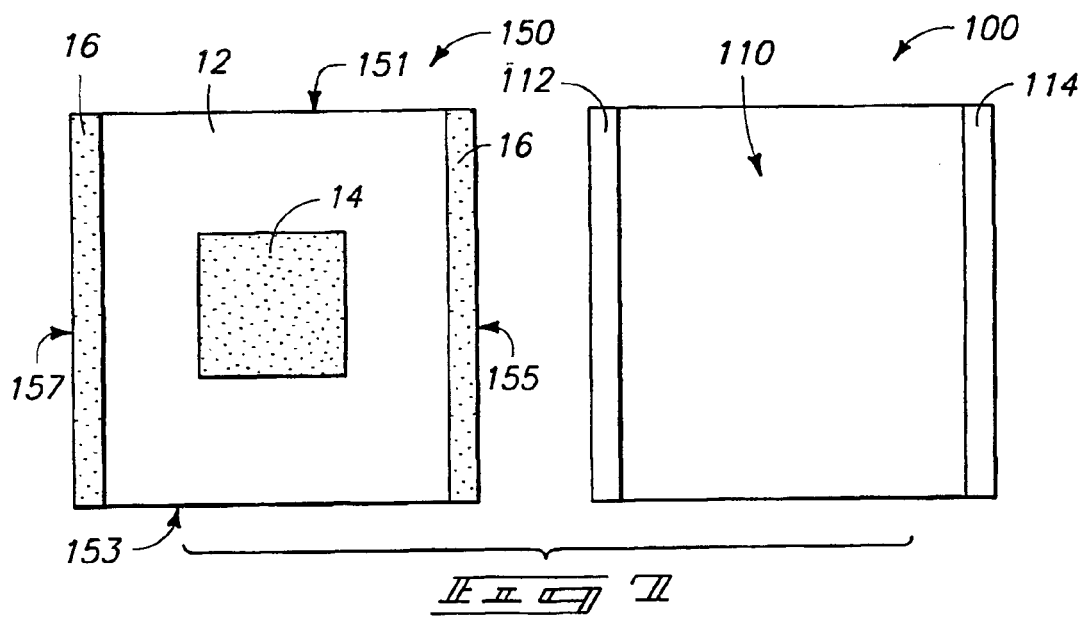
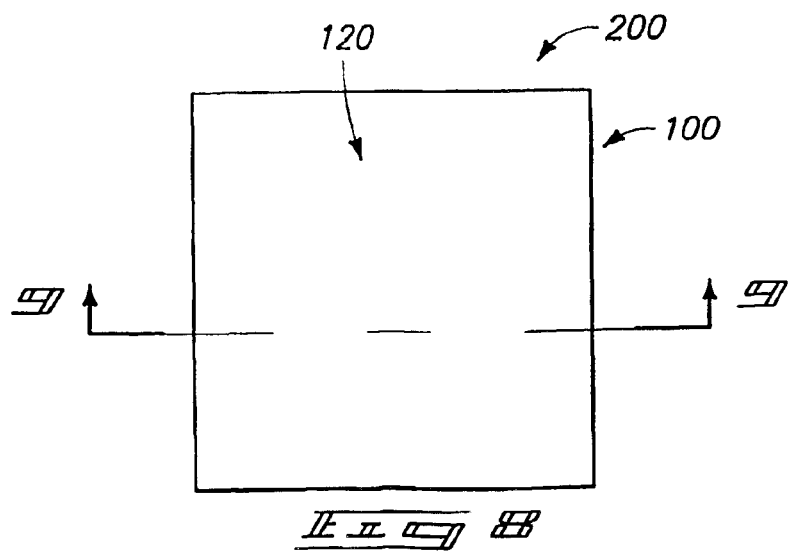

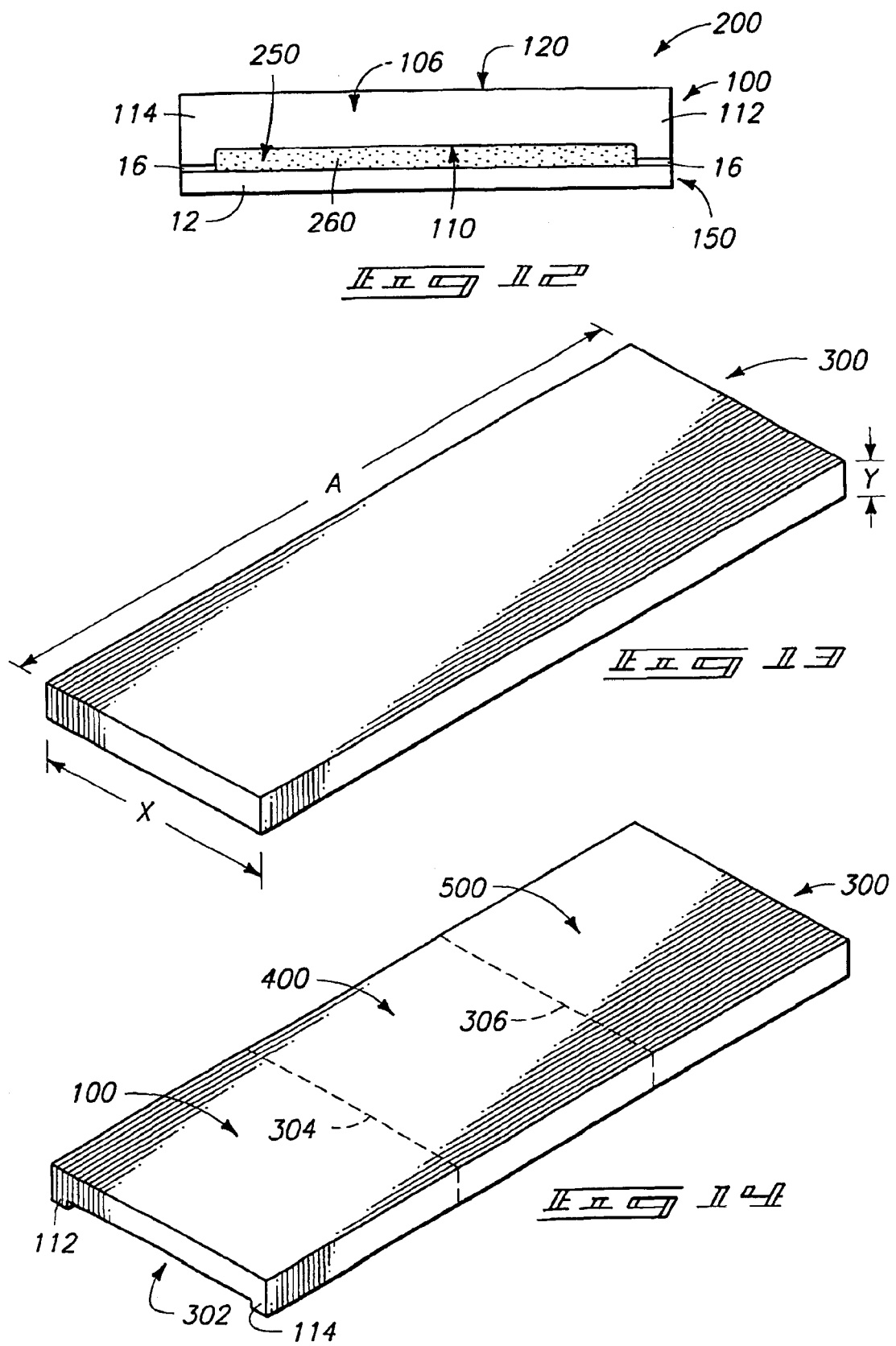

MICROELECTRONIC PACKAGES HAVING RAIL ALONG PORTION OF LID PERIPHERY

RELATED PATENT DATA

This application claims priority to PCT application Ser. No. PCT/USO1/44849, which was filed Oct. 30, 2001, and which claims priority to U.S. Provisional Application Ser. No. 60/249,043. which was filed Nov. 14. 2000.

TECHNICAL FIELD

This invention pertains to microelectronic lid designs, heat spreader designs, and semiconductor packaging.

BACKGROUND OF THE INVENTION

Modem semiconductor device packaging typically involves provision of a microelectronic lid over a semiconductor die (also referred to as a chip) to protect the die during transport. The microelectronic lid can be thermally conducted with the die so that heat generated from the die is dispersed into the lid. Accordingly, the lid can function as a heat spreader in addition to functioning as a protective cover for the die.

A prior art semiconductor package is described with reference to FIGS. 1–4. Referring initially to FIG. 1, the package comprises a base 10 and a lid 30, which are initially provided as separate pieces. Base 10 can comprise a substrate 12, which can be a circuit-retaining construction, such as, for example, a circuit board. A semiconductor chip 14 is provided in electrical connection with the circuit of circuit-retaining construction 12, and can, for example, be connected to such circuit through solder bead electrical interconnects (not visible in the view of FIG. 1). A sealant material 16 is provided around an outer periphery of circuit-retaining construction 12, and can comprise, for example, an epoxy. The surface of base 10 that is shown in FIG. 1 will ultimately be an inner surface in a package construction formed with lid 30.

Referring next to lid 30, such comprises a recessed surface 32 surrounded by a non-recessed peripheral portion 34. Lid 30 also comprises a surface 36 that is in opposing relationship to surface 32, and accordingly that is a hidden underside of lid 30 in the view of FIG. 1. The surface 32 of lid 30 will ultimately be an inner surface of the lid in a package formed with lid 30 and base 10, and the surface 36 will be an outer surface of such package.

FIG. 2 shows a top view of a package 40 comprising lid 30 and base 10. A process step in formation of package 40 is to invert lid 30 from the configuration shown in FIG. 1, and to press the lid over base 10. Lid 30 is sealed to base 10 by sealing peripheral portion 34 of lid 30 to the base with sealant material 16.

FIG. 3 shows a cross-sectional view through the package 40 of FIG. 2, and illustrates lid 30 joined with base 10. Also visible in FIG. 3 are electrical interconnects 42 extending downwardly from chip 14 to electrically connect the chip with circuitry (not shown) retained in substrate 12. Additionally, FIG. 3 shows a thermally conductive interface material 44 provided on chip 14 and thermally connecting lid 30 with chip 14 to allow heat dispersion from chip 14 into lid 30. If material 44 were not present, or were replaced with a non-thermally conductive material, lid 30 would simply be a microelectronic lid. However, if material 44 is a thermally conductive material, lid 30 functions as a heat spreader, with the term heat spreader understood to indicate a construction that primarily spreads heat in two dimensions, rather than in three dimensions.

FIG. 4 illustrates the package 40 of FIG. 3 attached to a heat sink 50 through a thermally conductive interface material 52. Material 52 can comprise, for example, GELVET™, which is commercially available from Honeywell International, Inc. Heat sink 50 can comprise, for example, aluminum having a shape which incorporates numerous projecting fins and/or posts. The heat sink 50 is distinguished from a heat spreader, in that heat sink 50 disperses heat in three dimensions, rather than two.

It can be problematic and costly to fabricate a lid having the complexity of lid 30. Accordingly, it would be desired to develop improved microelectronic lid designs.

SUMMARY OF THE INVENTION

The invention encompasses microelectronic package lids, heat spreaders, and semiconductor packages comprising microelectronic lids or heat spreaders. In particular aspects of the present invention, a microelectronic lid comprises a material having a rectangular peripheral shape that defines 4 peripheral sides. Further, the lid has projecting peripheral rails along less than all of the peripheral edge. For instance, the lid can have projecting peripheral rails along only 2 of the sides. Alternatively, such microelectronic lid can be described as, comprising a generally rectangular shape defining 4 peripheral edges, with 2 of the edges having a greater thickness than the other 2 edges.

The invention also encompasses heat spreaders having the above-described shapes of the microelectronic lids, and comprising materials with a thermal conductivity of at least 100 watts/meter-kelvin, preferably at least 150 watts/meter-kelvin, and more preferably greater than 200 watts/meter-kelvin. In particular embodiments, the heat spreaders can comprise, consist or, or consist essentially of copper, and can have a thermal conductivity of about 350 watts/meter-Kelvin. In other embodiments, the heat spreaders can comprise, consist of, or consist essentially of aluminum, and can have a thermal conductivity of about 220 watts/meter-kelvin.

BRIEF DESCRIPTION OF THE DRAWINGS

Preferred embodiments of the invention are described below with reference to the following accompanying drawings.

FIG. 6 is a side view of the FIG. 5 lid.

FIG. 7 is a view of the FIG. 5 lid in combination with a base, and shown at a preliminary step of forming a microelectronic package encompassed by the present invention.

The base of FIG. 7 is shown in top view, while the lid is shown in bottom view.

FIG. 8 is a top view of a package assembled utilizing the lid and base of FIG. 7.

Figure 9:
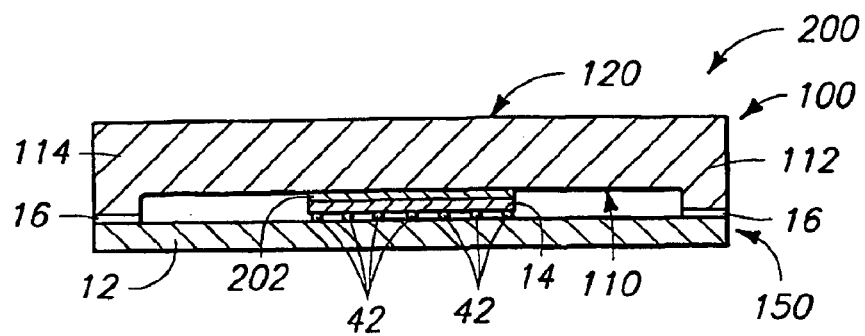

FIG. 9 is a cross-sectional view of the package of FIG. 8 shown along the line 9—9.

Figure 10:
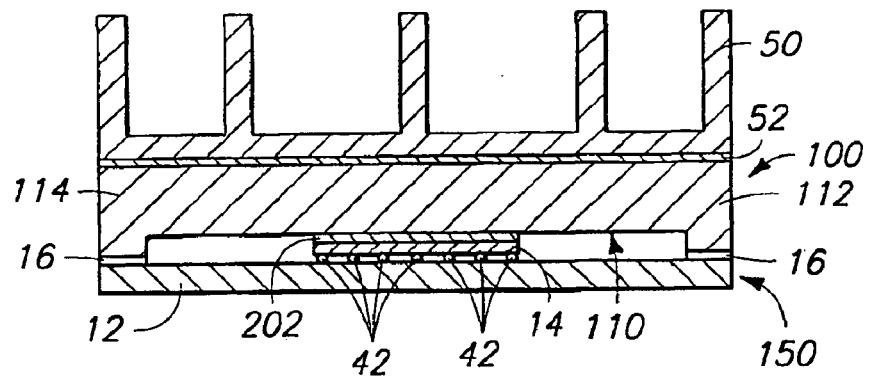

FIG. 10 is a cross-sectional view of the FIG. 8 package shown along the line 9—9, and shown at a processing step subsequent to that of FIG. 9.

Figure 11:
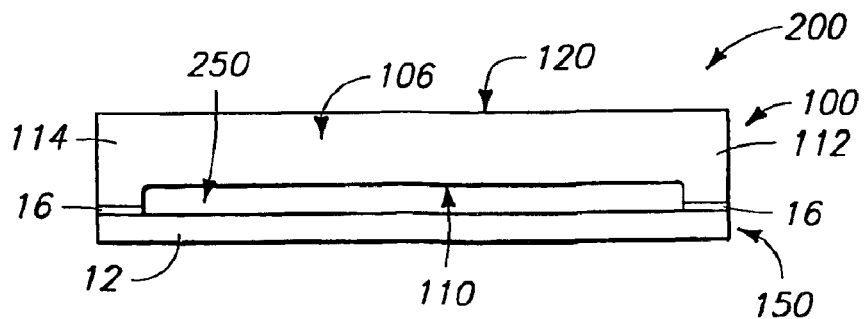

FIG. 11 is a sideview of the FIG. 8 package.

FIG. 12 is a sideview of the FIG. 8 package, and shown in accordance with an embodiment of the present invention different than that of FIG. 11.

FIG. 13 is an isometric view of a piece of lid stock at a preliminary step of forming lids in accordance with a method of the present invention.

FIG. 14 is an isometric view of the lid stock of FIG. 13 shown at a processing step subsequent to that of FIG. 13.

DETAILED DESCRIPTION OF THE PREFERRED EMBODIMENTS

A microelectronic lid, or alternatively a heat sink, encompassed by the present invention is described with reference to FIG. 5, and is shown generally as a lid 100. Lid 100 comprises a generally rectangular shape (although other shapes are encompassed by the present invention, with such other shapes including, for example, circular, triangular, pentagonal, or other polygonal shapes). Lid 100 comprises a periphery defined by the four edges 102, 104, 106 and 108. Lid 100 also comprises a recessed surface 110, which is coextensive with the surface of edges 102 and 106; and raised rails 112 and 114 which extend along edges 108 and 104. Additionally, lid 100 comprises a surface 120 (not visible in the view of FIG. 5) which is in opposing relation to surface 110.

Figure 1:
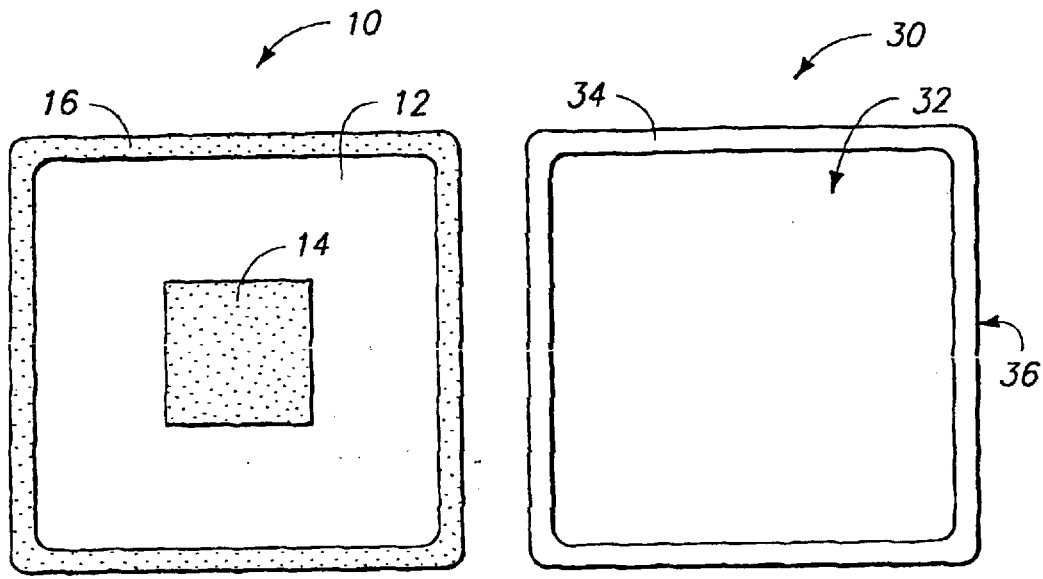
FIG. 1 is a diagrammatic view of a microelectronic package at a preliminary step of a prior art method for forming a package, and is shown comprising a lid which is separate from a base. The lid is shown in a bottom view, and the base is shown in top view.
Figure 2:
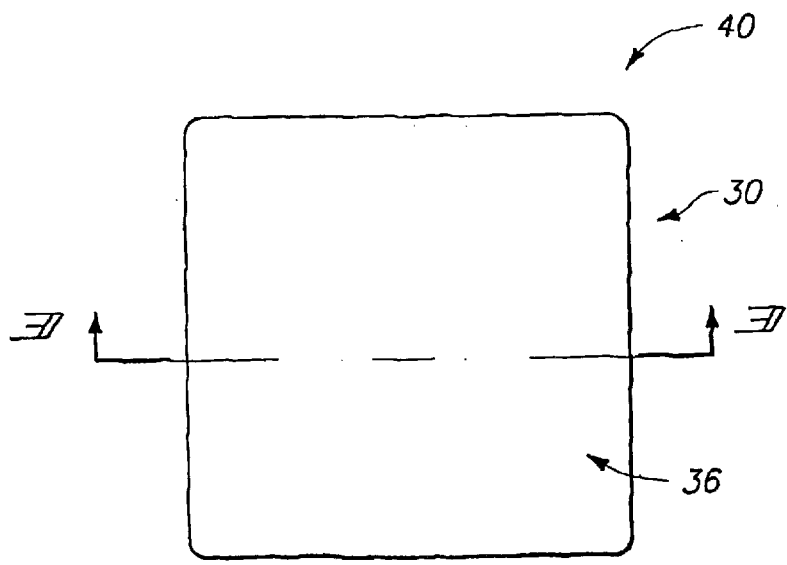
FIG. 2 is a view of a package comprising the lid and base of FIG. 1, and is shown in top view.
Figure 3:
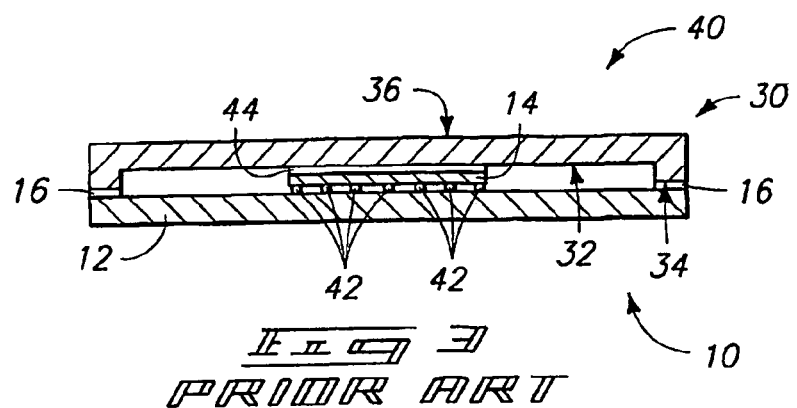
FIG. 3 is a view of the FIG. 2 package shown along the line 3—3.
Figure 5:
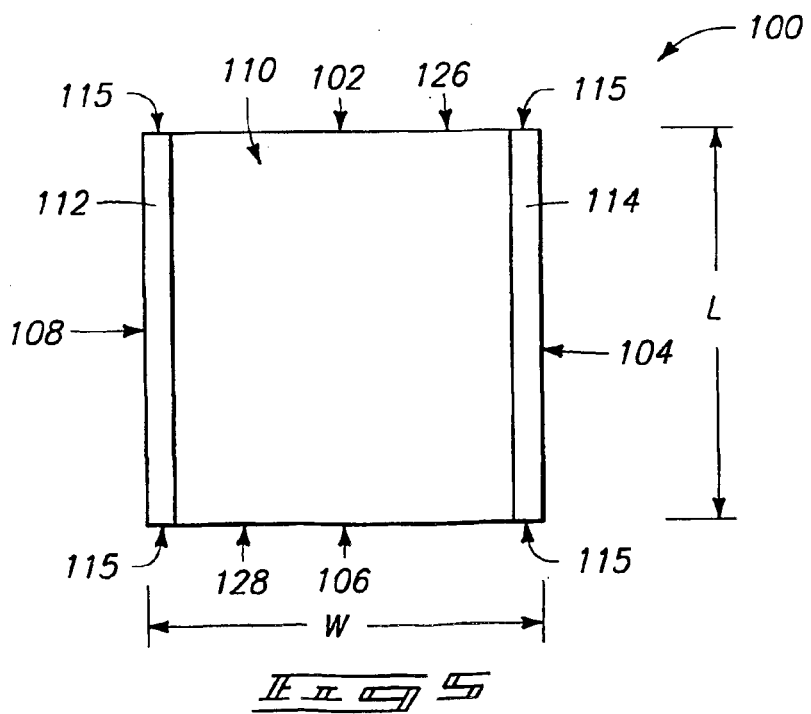
FIG. 5 is a diagrammatic bottom view of a microelectronic lid, or alternatively a heat spreader, encompassed by the present invention.

A difference between the lid 100 of FIG. 5 and the prior art lid 30 (shown in FIG. 1) is in lid 100 having raised portions (112 and 114) extending along only a part of the periphery of the lid. In contrast, the prior art lid 30 has a raised portion (34) extending along its entire periphery.

In the shown embodiment, lid 100 comprises a rectangular shape, and the raised peripheral portions are along two opposing sides (104 and 108) of the peripheral shape, while the remaining two sides (102 and 106) do not have raised portions extending along the predominate extent of such edges. In fact, the only raised portions associated with edges 102 and 106 are the terminal ends of raised portions 112 and 114, with such ends being the regions of portions 112 and 114 that contact edges 102 and 106. Such terminal portions of rails 112 and 114 are identified in FIG. 5 by the label 115. Accordingly, edge 102 has an expanse 126 extending along the edge between terminal ends 115 of rails 112 and 114, and such expanse 126 is not raised relative to surface 110. Similarly, edge 106 has an expanse 128 extending between terminal ends 115 which is not raised relative to surface 110.

FIG. 6 shows a side view of lid 100 along the side 106. Such side view illustrates the relationship of rails 112 and 114 relative to surface 110, and further shows expanse 128 extending between rails 112 and 114. Rails 112 and 114 define a groove 119 extending therebetween.

Exemplary dimensions of the lid 100 of FIGS. 5 and 6 are a width "W" of about 35±0.35 millimeters; a length "L" of about 35±0.35 millimeters, and a thickness "T" of about 4.6±0.05 millimeters. Further, groove 119 can have a depth "D" of about 0.6±0.025 millimeters.

Referring next to FIG. 7, lid 100 is shown adjacent a base 150, which is ultimately to be capped by lid 100 to form a package. Base 150 comprises four peripheral edges (151, 153, 155 and 157), and is similar to the base 10 of FIG. 1 in that it comprises a die 14 over a substrate 12. Further, base 150 comprises a sealant 16 provided along peripheral edges of the substrate. However, a difference between base 150 of FIG. 7 and base 10 is that the sealant 16 is provided along only two of the peripheral edges of substrate 12 of base 150, rather than along the four peripheral edges as was done with base 10. Sealant 16 is provided along the two peripheral edges of the substrate 12 of base 150 that will ultimately contact raised edges associated with lid 100.

In a processing step subsequent to that of FIG. 7, lid 100 is placed over base 150, and rails 112 and 114 are sealed against the base with sealant 16 to form a package. Such package is shown in FIG. 8 as a package 200, and specifically is shown in top view, with surface 120 of lid 100 being visible.

Referring next to FIG. 9, package 200 is shown in cross-sectional view along the line 9—9 of FIG. 8. Such cross-sectional view shows solder beads 42 connecting die 14 with substrate 12. Also, the cross-sectional view shows a layer 202 formed between die 14 and lid 100. Layer 202 can comprise, for example, a thermally conductive material. If layer 202 comprises a thermally conductive material, then lid 100 can function as a heat spreader to dissipate heat generated by die 14. In alternative embodiments, layer 202 can be omitted, or can be replaced with a non-thermally conductive material. In either of such alternative embodiments, lid 100 will function as a microelectronic lid to protect die 14, but will generally not effectively dissipate heat from die 14, and accordingly will not be utilized as a heat spreader.

If lid 100 is utilized as a heat spreader, it preferably comprises a material with a thermal conductivity of at least 100 watts/meter-kelvin, and more perfectly at least 150 watts/meter-kelvin. In particular embodiments, lid 100 can comprise a material having a thermal conductivity in excess of 200 watts/meter-kelvin, such as, for example, copper or aluminum. In embodiments in which lid 100 comprises a metallic material, the lid can be nickel-plated. For instance, if lid 100 comprises copper or aluminum, it can be provided with a nickel-plating having a thickness of at least about 3 microns. The nickel plating can protect the underlying lid material from corrosion, and further can provide a reproducible surface for adherence to one or more thermal interface materials, as well as for adherence to epoxy.

Figure 4:
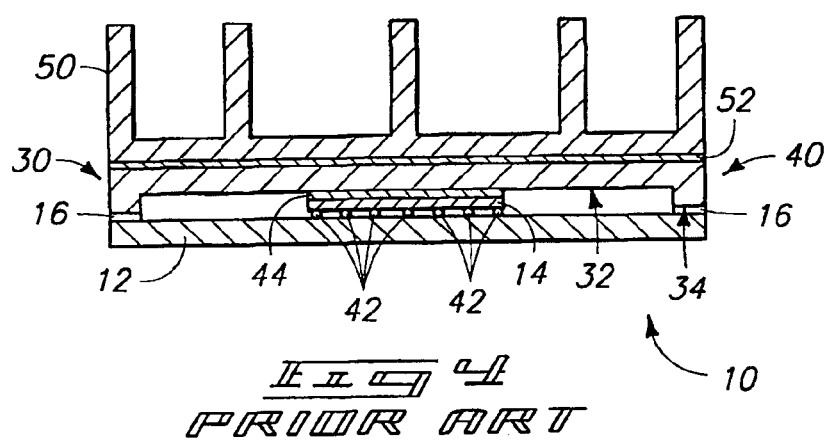
FIG. 4 is a view of the FIG. 2 package shown along the cross sectional view of FIG. 3, and shown at a processing step subsequent to that of FIG. 3.

Referring next to FIG. 10, package 200 is illustrated after formation of a heat sink 50 over the package, and a thermal interface 52 connecting heat sink 50 with package 200. Heat sink 50 and thermal interface 52 can comprise, for example, the materials described above with reference to the prior art construction of FIG. 4.

Referring next to FIG. 11, the package 200 of FIG. 8 is shown in a side view. The chip (14) is not shown in the side view of FIG. 11 to simplify the drawing, although it is to be understood that chip 14 would be in the center of package 200 as illustrated by, for example, FIG. 9. The view of FIG. 11 shows that there is a gap 250 at the end of package 200 corresponding to a space between rails 112 and 114. Such gap will typically be narrow, and in particular embodiments of the present invention can be left unfilled. However, if it is desired to fill gap 250 to prevent dirt or other contaminants from penetrating between lid 100 and substrate 150, such can be accomplished by providing a filler material within the gap. Such is illustrated in FIG. 12, wherein gap 250 is filled with a filler material 260. Filler material 260 can comprise, for example, epoxy. Filler material 260 can be provided after formation of package 200 by applying the filler material into gap 250. Alternatively, filler material 250 can be provided before formation of package 200 at, for example, the processing step of FIG. 7, by providing the filler material at edges 151 and 153 of substrate 150.

The lid 100 of the present invention can be advantageous relative to prior art lids (such as, for example, the lid 30 of FIG. 1) in that lid 100 can be simpler to manufacture than the prior art lids. Lid 100 can be formed by, for example, the processing of FIGS. 13 and 14. Referring initially to FIG. 13, a bar 300 of lid stock is provided. The bar comprises dimensions "A", "X", and "Y". Dimension "X" corresponds to a width along edge 106 of a finished lid 100 (FIGS. 5 and 6), and dimension "Y" corresponds to a thickness of rails 112 and 114 of a finished lid 100. The dimension "A" is preferably longer than several integral lengths of edge 108 of a finished lid 100.

Referring next to FIG. 14, bar 300 is machined to form a groove 302 extending along a surface of the bar. Groove 302 defines rails 112 and 114 extending along edges of the lid stock. The stock can subsequently be cut along dashed lines 304 and 306 to define separated lids 100, 400 and 500. The lids separated lids can subsequently be subjected to electroplating if a metal plating is desired over the material of the lids.

Although FIGS. 13 and 14 illustrate a process wherein a lid stock bar 300 is machined to form groove 302, it is to be understood that the invention encompasses alternative processing wherein the grooved material of FIG. 14 is formed by extruding a lid material into the shown shape.

What is claimed is :

1. A microelectronic package, comprising:
    a base;
    a chip supported by the base;
    a microelectronic lid over the chip; the chip accordingly being packaged between the microelectronic lid and the base;
    a thermally conductive connection between the microelectronic lid and the chip; and
    the lid comprising:
        a lid material having a shape and a peripheral edge surrounding the shape; the lid material comprising metal-plated copper or metal-plated aluminum;
        a surface surrounded by the peripheral edge;
        a rail which extends along only a portion of the peripheral edge and which is elevationally raised relative to the surface; and
        the shape being a rectangular shape defining four peripheral sides of the peripheral edge, the rail extending along an entirety of two of the peripheral sides and not extending laterally beyond the peripheral edge, while at least a predominate portion of the remaining two sides does not have the rail extending there-along.

2. The microelectronic package of claim 1 wherein the two of the peripheral sides along which the rail extends are in opposing relation to one another.

3. The microelectronic package of claim 1 wherein the rectangular shape is a square shape.

4. The microelectronic package of claim 1 wherein the microelectronic lid has a thermal conductivity of at least about 100 watts/meter-Kelvin.

5. The microelectronic package of claim 1 wherein the microelectronic lid has a thermal conductivity of at least about 150 watts/meter-Kelvin.

6. The microelectronic package of claim 1 wherein the microelectronic lid has a thermal conductivity of at least about 200 watts/meter-Kelvin.

7. The microelectronic package of claim 1 wherein the microelectronic lid consists essentially of metal-plated copper.

8. The microelectronic package of claim 1 wherein the microelectronic lid consists of metal-plated copper.

9. The microelectronic package of claim 1 wherein the microelectronic lid consists essentially of nickel-plated copper.

10. The microelectronic package of claim 1 wherein the microelectronic lid consists of nickel-plated copper.

11. The microelectronic package of claim 1 wherein the microelectronic lid consists essentially of metal-plated aluminum.

12. The microelectronic package of claim 1 wherein the microelectronic lid consists of metal-plated aluminum.

13. The microelectronic package of claim 1 wherein the microelectronic lid consists essentially of nickel-plated aluminum.

14. The microelectronic package of claim 1 wherein the microelectronic lid consists of nickel-plated aluminum.

* * * * *